United States Patent [19]

Wiedmann

[11] 3,770,519

[45] Nov. 6, 1973

[54] ISOLATION DIFFUSION METHOD FOR MAKING REDUCED BETA TRANSISTOR OR DIODES

[75] Inventor: Siegfried K. Wiedmann, Untergruppenbach, Germany

[73] Assignee: International Business Machines Corporation, Armonk, N.Y.

[22] Filed: Aug. 5, 1970

[21] Appl. No.: 61,128

[52] U.S. Cl. ...................... 148/175, 29/577, 29/578, 117/201, 148/187, 317/235 R

[51] Int. Cl. ......... H01l 7/36, H01l 19/00, H01l 7/44

[58] Field of Search ............................ 148/175, 187; 317/234, 235; 117/201, 212, 213; 29/577, 578

[56] References Cited

UNITED STATES PATENTS

| | | | |
|---|---|---|---|
| 3,474,309 | 10/1969 | Stehlin | 317/235 |
| 3,524,113 | 8/1970 | Agusta et al. | 317/235 |
| 3,327,182 | 6/1967 | Kisinko | 317/235 |
| 3,442,723 | 5/1969 | Wakamiya | 148/186 |
| 3,506,893 | 4/1970 | Dhaka | 148/175 X |
| 3,547,716 | 12/1970 | De Witt et al. | 148/175 |
| 3,596,149 | 7/1971 | Makimoto | 148/187 X |
| 3,404,450 | 10/1968 | Karcher | 29/577 |
| 3,305,913 | 2/1967 | Loro | 317/235 X |
| 3,312,882 | 4/1967 | Pollock | 317/235 |
| 3,441,815 | 4/1969 | Pollock et al. | 317/235 |
| 3,525,911 | 8/1970 | Ryerson | 317/235 |
| 3,581,164 | 5/1971 | Pfander et al. | 317/234 |

*Primary Examiner*—L. Dewayne Rutledge
*Assistant Examiner*—W. G. Saba
*Attorney*—Hanifin and Jancin and Robert J. Haase

[57] ABSTRACT

A method for making reduced beta transistors within one of a plurality of isolated regions of a microcircuit structure. The beta reduction is accomplished by using standard isolation diffusion technology modified only to the extent of opening a hole in the isolation diffusion mask at the base location of each desired reduced beta transistor having a subcollector. The isolation impurity, being of the same conductivity type as the base diffusion and being of relatively high impurity concentration, reduces the emitter efficiency of each desired reduced beta transistor to an extent whereby the reduced beta transistor functions substantially as a self-isolated diode. Self-isolation of the diodes is achieved utilizing a minimum of microcircuit device surface area by elimination of separate isolating regions for the resulting diodes.

1 Claim, 7 Drawing Figures

INVENTOR
SIGFRIED K. WIEDMANN

BY Robert J. Haase
ATTORNEY

ISOLATION DIFFUSION METHOD FOR MAKING REDUCED BETA TRANSISTOR OR DIODES

BACKGROUND OF THE INVENTION

There is an ever increasing need to maximize component packing density in microcircuit devices in order to reduce cost and to increase operational speed by reducing circuit interconnection path lengths. To this end, efforts are being made to find ways of achieving desired microcircuit functions with a minimum of semiconductor space allocation. One of the major areas in which substrate material can be conserved is through the elimination of unnecessary isolation regions between circuit components. Self-isolated components make possible very substantial increases in component packing density. It is important, however, that packing density be increased without impacting previous accomplishments. Thus, an important consideration in the fabrication of self-isolated components is the compatibility of the process by which it is made in terms of existing technology. New processes, as well as those which entail significant departures from existing technology are to be avoided. The most desirable process for making a self-isolated component is one which adheres maximally to established and proven processes.

Diodes are utilized in great numbers in contemporary microcircuit designs. Much attention has been directed at evolving techniques for fabricating diodes which are compatible with existing process technologies. For example, in the book "Integrated Circuits" edited by Raymond M. Warner, Jr., McGraw-Hill, 1965, pages 195–197, five different techniques are discussed for obtaining the diode function by modification of a preexisting transistor structure. It is noted, however, that the resulting diodes lack a self-isolation characteristic. That is, if a plurality of the converted transistors are to be formed on the same monolithic semiconductor substrate, it is necessary to provide electrical isolation between the adjacent diodes to avoid undesired electrical interaction. Conventional isolation regions, such as formed by diffusion, for example, are undesirably extravagant in terms of available semiconductor substrate space. Very substantial savings of substrate material would be achieved through the technique of obtaining the diode function by appropriate modification of a transistor if the modification also imparted self-isolation characteristics to the diode. It would be additionally advantageous if these desiderata are achieved at the expense of minimum departure from existing processing technology.

SUMMARY OF THE INVENTION

A method for obtaining the function of a diode by modification of a transistor utilizing substantially standard processing technology. In a preferred embodiment, only one departure is made from conventional isolation diffusion practices, the departure consisting of providing additional holes in the isolation diffusion mask at predetermined locations so that additional heavy impurity concentration diffusions can be made at predetermined locations simultaneously with the making of the isolation diffusions. In accordance with a standard prior art process, a plurality of transistors are formed within each isolated region of a plurality of isolated regions in an epitaxial layer. The isolation diffusions (defining the isolated regions) are made through the top surface of the epitaxial layer to the underlying substrate before the base and emitter diffusions are made to form the transistors. In accordance with the present invention, the isolation diffusion mask is designed to allow simultaneous diffusions at locations where diode functions are desired in addition to the locations of the isolation regions. Each diode function is achieved by a substantial reduction in the Beta of a respective transistor previously equipped with a subcollector. Beta reduction is achieved, in turn, by the aforesaid simultaneous diffusions in the base region surrounding the emitters of selected transistors to reduce emitter efficiency and to increase base width. Penetration of the simultaneous base diffusion to the underlying substrate is prevented by the subcollector of each of the selected transistors. Inasmuch as the heavily doped emitter-base junction of each reduced beta transistor provides very short carrier lifetime, fast switching operation can be achieved in the resulting diode functions. The resulting diodes correspond to the emitter base junctions of the reduced Beta transistors. The reduction in Beta of a plurality of transistors formed within the same isolation region of a semiconductor substrate effectively electrically isolates the respective collector regions whereby the resulting diodes are substantially isolated from each other without requiring the allocation of additional substrate space for isolation purposes. The resulting effective diodes can be formed readily in varying circuit configurations in combination with high Beta transistors and other components as desired by the circuit designer.

DESCRIPTION OF THE PREFERRED EMBODIMENTS

Figure 1:
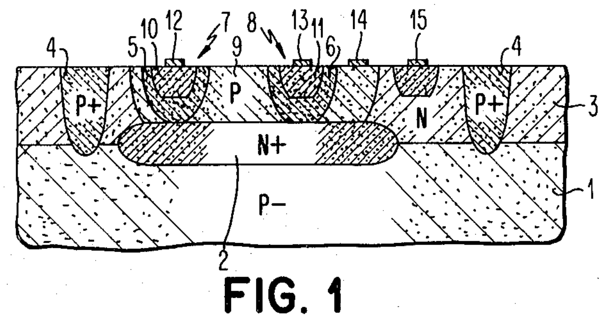
FIG. 1 is a cross-sectional view and FIG. 1A shows the corresponding equivalent circuit of a pair of effective diodes connected together at one pole produced in accordance with the present invention.

The method of the present invention is fully compatible with existing conventional isolation diffusion processes for making planar integrated microcircuits. In the exemplatory case of FIG. 1, the microcircuit is formed on silicon substrate 1 of a P− conductivity type. A pocket 2 of N+ impurity material (to serve as the subcollector region of a pair of transistors) is placed on the surface of substrate 1 prior to the deposition of epitaxial layer 3 of N conductivity type material. The upper surface of epitaxial layer 3 is subjected to the conventional steps of photomasking, oxide growing and chemical etching for the diffusion of impurities of predetermined conductivity types and concentrations at desired locations. In this manner, closed-loop isolation walls of P+ impurity concentration is made to delineate an interior isolated region within which the desired transistor pair is to be formed. Although not shown, it is to be understood that additional isolated regions are produced by the simultaneous diffusion of other walls similar to wall 4.

In accordance with the present invention, P+ diffusions are made in the base region portions 5 and 6 of transistors 7 and 8 simultaneously with the making of isolation diffusion 4. This is accomplished merely by altering the isolation diffusion mask normally used in the conventional planar process to provide additional diffusion windows at the locations of base regions 5 and 6 on the top surface of epitaxial layer 3. The remaining steps by which transistors 7 and 8 are completed are the same as those of the conventional prior art. That is a P diffusion is made into the total base region 9 which is jointly shared by transistors 7 and 8 in the exemplary embodiment. Then, N+ emitter diffusions 10 and 11 and ohmic contacts 12, 13, 14 and 15 are formed in the usual manner.

Figure 1A:
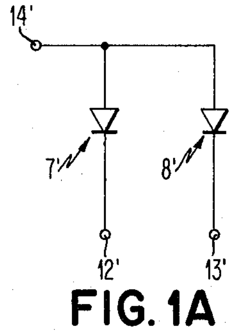

It will be noted that the structure represented in FIG. 1 is conventional except for the P+ diffusions 5 and 6 which are made in the commonly shared base region 9 surrounding the emitters 10 and 11 of respective transistors 7 and 8. The increased impurity concentrations in the base regions 5 and 6 contiguous to the emitter regions 10 and 11 substantially reduce the emitter efficiencies of transistors 7 and 8. When, as in the case of the present invention, the added base impurity concentration in regions 5 and 6 is produced from the same isolation impurity source, diffusion time and temperature as are employed simultaneously in the formation of isolation wall 4, the Beta of each of npn transistors 7 and 8 is reduced from one to two orders of magnitude. The resulting structures function as reduced beta transistors or diodes as shown in the functionally equivalent schematic circuit of FIG. 1A. Diodes 7′ and 8′ represent reduced Beta transistors 7 and 8 of FIG. 1 and are connected to each other at their positive poles by virtue of the base region 9 which they commonly share in the structure of FIG. 1. Thus, diodes 7′ and 8′ correspond to the emitter-base diodes of transistors 7 and 8, respectively, terminal 14′ corresponds to base ohmic contact 14, and contacts 12′ and 13′ correspond to emitter ohmic contacts 12 and 13.

Figure 2:
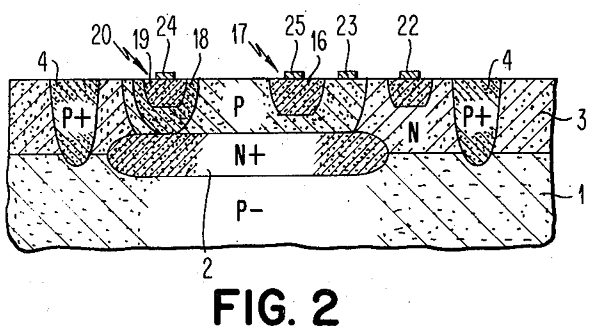
FIG. 2 is a cross-sectional view and FIG. 2A shows the corresponding equivalent circuit of an effective diode connected at one pole at the base region of a relatively high beta transistor produced in accordance with the present invention.
Figure 2A:
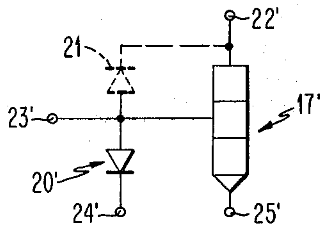

The cross-sectional view of FIG. 2 represents an alternative structure provided by the method of the present invention characterized by the functionally equivalent schematic circuit of FIG. 2A. The process by which the structure of FIG. 2 is formed is identical to the process employed in the case of FIG. 1 except that no isolation diffusion (P+) is placed in the base region surrounding the emitter 16 of transistor 17. Isolation impurity is diffused only in region 18 of the base surrounding emitter 19 of transistor 20 as in the manner of both transistors 7 and 8 of FIG. 1. This relatively simple modification results in the formation of a reduced Beta transistor 20 represented by diode 20′ of FIG. 2A and a normally high beta transistor 17 represented by transistor 17′ of FIG. 2A. For the sake of completeness in the functionally equivalent schematic circuit of FIG. 2A, dotted diode 21 is shown connected between the anode of diode 20′ and the collector terminal 22′ corresponding to collector ohmic contact 22 of FIG. 2. Diode 21 represents the base-collector diode of reduced beta transistor 20 of FIG. 2. Provision must be made by the microcircuit device designer to assure that the base-collector diode 21 is reversed biased in the normal operation of the circuit. This can be achieved, for example, simply by operating the high beta transistor 17 in a non-saturation mode. Contact 23′ of FIG. 2A corresponds to base ohmic contact 23, contact 24′ corresponds to emitter ohmic contact 24 and contact 25′ corresponds to emitter onmic contact 25, respectively.

It will be observed by those skilled in the art that the functionally equivalent schematic circuit of FIG. 2A is widely used in microcircuit designs including bi-polar flip-flop circuits and differential amplifiers. The circuit of FIG. 2A is achieved in accordance with the present invention without the necessity of introducing an isolation region (requiring additional substrate spaced allocation) between the diode 20′ and the transistor 17′ and without departing in any objectionable manner from a standard planar isolation diffusion process for forming a conventional dual emitter transistor in an epitaxial layer. The diode 20′ is achieved merely by introducing impurity carriers in the base region surrounding one of the emitters simultaneously with making the isolation wall delineating the isolated region in which the dual emitter transistor is being formed.

Figure 3:
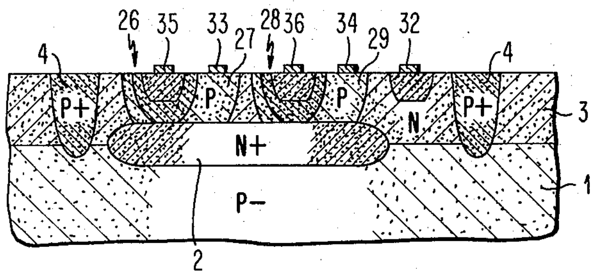
FIG. 3 is a cross-sectional view and FIG. 3A shows the corresponding equivalent circuit of a pair of effective diodes electrically isolated at both poles from each other produced in accordance with the present invention.
Figure 3A:
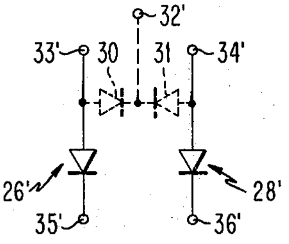

FIG. 3 represents yet another alternative microcircuit device which is readily obtained by the method of the present invention. The device of FIG. 3 differs from the devices of FIGS. 1 and 2 in that the transistors 26 and 27 of FIG. 3 have individual base regions 27 and 29 rather than sharing a common base region as in the cases of the transistors of FIGS. 1 and 2. Except for the provision of separate base diffusions, the microcircuit device represented by FIG. 3 is made by the same process previously described in connection with FIG. 1. The separate base regions 27 and 29 eliminates the common anode connection between the equivalent diodes such as a common anode connection between diode 7′ and 8′ of FIG. 1A and yields the functionally equivalent schematic circuit of FIG. 3A. Diodes 26′ and 28′ correspond to reduced beta transistors 26 and 28 of FIG. 3. Diodes 30 and 31 correspond to the base-collector diodes of transistors 26 and 28, respectively. Diodes 30 and 31 are maintained back-biased by application of a positive potential of terminal 32′ corresponding to the collector ohmic contact 32 of FIG. 3. Contacts 33′ , 34′ 35′ and 36′ correspond to ohmic contacts 33, 34, 35 and 36, respectively, of FIG. 3. It will be observed that effective diodes 26′ and 28′ of FIG. 3A are electrically isolated from each other in a structure requiring no separate space allocation for an isolation region simply by applying a positive potential to collector ohmic contact 32 of FIG. 3 sufficient to back-bias diodes 30 and 31 of FIG. 3A.

In each of the described embodiments of the present invention, separate base diffusions were made in the base regions of the reduced beta transistor subsequent to the isolation diffusion step. For example, FIG. 1, a separate base diffusion was made in region 9 subsequent to the isolation diffusion step wherein diffusions were made simultaneously in regions 4, 5, and 6. The P conductivity diffusion in region 9 substantially has no effect on the impurity concentration within regions 5 and 6 due to the previously made heavy P+ diffusion in the same regions 5 and 6. Thus, the P base diffusion need not be made subsequent to the P+ beta reduction diffusions in regions 5 and 6 insofar as the electrical characteristics of the resulting reduced beta transistors are concerned. However, it is advantageous to make the conventional P diffusion throughout base region 9 because of the oxide etching step associated with the conventional base diffusion step which removes the relatively thick oxide covering the P+ diffused areas 5 and 6 resulting from the isolation diffusion step during which regions 4, 5, and 6 were diffused. Relatively thin oxide is regrown over the entire base area 9 during the conventional P base diffusion step. The relatively thin oxide regrowth facilitates the opening of emitter holes for making the subsequent N+ diffusions in regions 10 and 11. It would be more difficult to open small emitter diffusion windows in the relatively thick oxide which would be present were there no P base diffusion step intervening the P+ diffusion in regions 5 and 6 and the N+ diffusion in regions 10 and 11. Accordingly, it is preferable that separate base diffusions be made in the base regions of the reduced beta transistors as well as in the base regions of the normal high beta transistors such as transistor 17 of FIG. 2. In any event, the decision of whether or not a separate base diffusion is made in a given reduced beta transistor does not impact the fabrication process being employed, the only variation being whether or not a window is provided at the respective location in the base diffusion mask.

Figure 4:
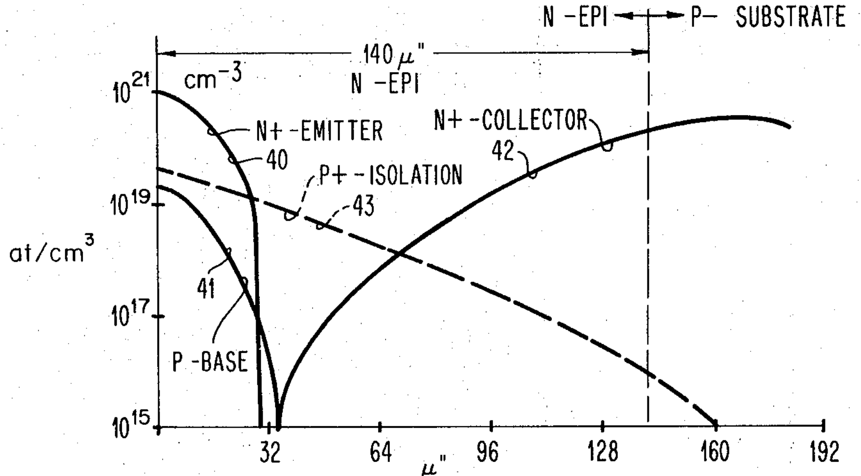
FIG. 4 is an impurity profile plot of a typical reduced beta transistor produced in accordance with the present invention.

FIG. 4 represents the typical impurity profiles of a reduced beta transistor and a normal beta transistor as depicted in FIGS. 2 and 2A. Emitter impurity profile 40, base profile 41 and subcollector profile 42 represent the respective impurity profiles for the reduced beta transistor 20 and the normal beta transistor 17 of FIG. 2. Reduced beta transistor 20, however, is further characterized by the P+ isolation impurity profile 43. The epitaxial layer thickness in the given example is 140 microinches. Some typical measured results obtained from tests made with the reduced beta transistor and the normal beta transistor exhibiting the impurity profiles of FIG. 4 are summarized in the following table:

| | $T_1$ (Normal Beta Transistor) | $T_2$ (Reduced Beta Transistor) |
|---|---|---|
| Current gain (beta) at $I_c$=200 microamperes | 45 | 0.8 |
| Current gain (beta) at $I_c$=20 microamperes | 40 | 0.75 |
| Inverse current gain at $I_c$=100 microamperes | 1.5 | 0.01 |
| Emitter-base breakdown voltage | 5.4 volts | 4.8 volts |

While this invention has been particularly described with reference to the preferred embodiments thereof, it will be understood by those skilled in the art that the foregoing and other changes in form and details may be made therein departing from the spirit and scope of the invention.

What is claimed is:

1. The method for making a reduced beta transistor within at least one of a plurality of isolated regions in an epitaxial layer on a semiconductor substrate, said method comprising providing a semiconductor substrate of one conductivity type, placing subcollectors of a conductivity type opposite said one conductivity type in said substrate, depositing an epitaxial layer of semiconductor material on said substrate and over said subcollectors, said epitaxial layer having said opposite conductivity type, diffusing a realtively high concentration of impurity material of said one conductivity type through said epitaxial layer and into said substrate at first locations other than where said subcollectors are placed to delineate said isolated regions and at the same time at least at a second location over one of said subcollectors where a reduced beta transistor is to be made, said impurity material in each said second location reaching through said epitaxial layer to the respective subcollector but not penetrating through said respective subcollector, and forming by diffusion at said second location said reduced beta transistor, said forming step including the steps of diffusing a base region of said one conductivity type into said epitaxial layer about said second location wherein said base region is diffused through said epitaxial layer to said subcollector and diffusing an emitter region of said opposite conductivity type into said epitaxial layer at a third location surrounded by said second location.

* * * * *

PO-1050
(5/69)

UNITED STATES PATENT OFFICE
CERTIFICATE OF CORRECTION

Patent No. 3,770,519 Dated November 6, 1973

Inventor(s) Seigfried K. Wiedmann

It is certified that error appears in the above-identified patent and that said Letters Patent are hereby corrected as shown below:

Column 2, line 39 second occurrence "at" should be --to--

Signed and sealed this 14th day of May 1974.

(SEAL)
Attest:

EDWARD M.FLETCHER,JR.
Attesting Officer

C. MARSHALL DANN
Commissioner of Patents